(12) United States Patent
Yoshioka et al.

(10) Patent No.: US 9,607,875 B2
(45) Date of Patent: Mar. 28, 2017

(54) ADHESIVE COMPOSITION, LAMINATE, AND STRIPPING METHOD

(71) Applicant: Tokyo Ohka Kogyo Co., Ltd., Kanagawa (JP)

(72) Inventors: Takahiro Yoshioka, Kanagawa (JP); Koki Tamura, Kanagawa (JP); Hirofumi Imai, Kanagawa (JP); Atsushi Kubo, Kanagawa (JP); Yasumasa Iwata, Kanagawa (JP); Shingo Ishida, Kanagawa (JP)

(73) Assignee: TOKYO OHKA KOGYO CO., LTD., Kawasaki-Shi (JP)

(*) Notice: Subject to any disclaimer, the term of this patent is extended or adjusted under 35 U.S.C. 154(b) by 0 days.

(21) Appl. No.: 14/691,262

(22) Filed: Apr. 20, 2015

(65) Prior Publication Data
US 2015/0299534 A1   Oct. 22, 2015

(30) Foreign Application Priority Data

Apr. 22, 2014 (JP) ................ 2014-088539
Feb. 27, 2015 (JP) ................ 2015-039457

(51) Int. Cl.
| | | |
|---|---|---|
| C09J 125/06 | (2006.01) | |
| C09J 153/00 | (2006.01) | |
| B32B 7/12 | (2006.01) | |
| B32B 38/00 | (2006.01) | |
| H01L 21/683 | (2006.01) | |
| C09J 145/00 | (2006.01) | |
| B32B 7/06 | (2006.01) | |
| B32B 9/00 | (2006.01) | |
| B32B 9/04 | (2006.01) | |
| B32B 27/16 | (2006.01) | |
| B32B 27/20 | (2006.01) | |
| B32B 27/22 | (2006.01) | |
| B32B 27/28 | (2006.01) | |
| B32B 27/30 | (2006.01) | |
| C09J 153/02 | (2006.01) | |

(52) U.S. Cl.
CPC ............ *H01L 21/6836* (2013.01); *B32B 7/06* (2013.01); *B32B 7/12* (2013.01); *B32B 9/005* (2013.01); *B32B 9/045* (2013.01); *B32B 27/16* (2013.01); *B32B 27/20* (2013.01); *B32B 27/22* (2013.01); *B32B 27/281* (2013.01); *B32B 27/283* (2013.01); *B32B 27/302* (2013.01); *B32B 27/308* (2013.01); *C09J 145/00* (2013.01); *C09J 153/025* (2013.01); *H01L 21/6835* (2013.01); *B32B 2255/20* (2013.01); *B32B 2307/306* (2013.01); *B32B 2307/714* (2013.01); *B32B 2457/14* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC ......... C09J 153/00; C09J 125/00; B32B 7/06; B32B 7/12
See application file for complete search history.

(56) References Cited

U.S. PATENT DOCUMENTS

| | | | | |
|---|---|---|---|---|
| 4,264,181 A * | 4/1981 | Lentz | ................ | G03G 15/2057 219/216 |
| 2005/0233547 A1 | 10/2005 | Noda et al. | | |
| 2009/0133812 A1 | 5/2009 | Noda et al. | | |
| 2010/0038035 A1 | 2/2010 | Noda et al. | | |
| 2010/0041211 A1 | 2/2010 | Noda et al. | | |
| 2011/0297771 A1 | 12/2011 | Noda et al. | | |

FOREIGN PATENT DOCUMENTS

JP   2004-064040   2/2004

* cited by examiner

*Primary Examiner* — Robert Harlan
(74) *Attorney, Agent, or Firm* — Knobbe Martens Olson & Bear LLP

(57) ABSTRACT

An adhesive composition for temporarily attaching a substrate to a support plate which supports the substrate, and includes a thermoplastic resin and a release agent.

10 Claims, 2 Drawing Sheets

ADHESIVE COMPOSITION, LAMINATE, AND STRIPPING METHOD

CROSS-REFERENCE TO RELATED APPLICATIONS

This application claims priority to Japanese Patent Application No. 2014-088539, filed Apr. 22, 2014; and Japanese Patent Application No. 2015-039457, filed Feb. 27, 2015, the contents of which are incorporated herein by reference.

BACKGROUND OF THE INVENTION

Field of the Invention

The present invention relates to an adhesive composition, a laminate, and a stripping method.

Background Art

Products such as a mobile telephone, digital AV equipment, an IC card, and the like have been improved to have more sophisticated functions. This gives rise to an increase in demand for semiconductor silicon chips (hereinafter, referred to as chips) provided in the products to be downsized and thinned so that the chips can be highly integrated in a package. For example, for an integrated circuit in which a plurality of chips are provided in one package, such as a chip size package (CSP) or an multi-chip package (MCP), there is a demand for the chips to be thinned. In order to highly integrate the chips in the package, it is necessary to thin the chips to a thickness in a range of 25 µm to 150 µm.

By a grinding process, semiconductor wafers (hereinafter, referred to as wafers) which serve as bases for the respective chips are thinned. This, however, weakens the strength of the wafers, and cracks and warp is likely to occur on the wafers. In addition, the wafers weakened in strength through the thinning are difficult to be carried automatically and need to be carried manually. As can be understood from this, handling of the wafers is troublesome.

As a countermeasure, a wafer handling system has been developed. According to the wafer handling system, a plate called a support plate, which is made from glass, hard plastic, or the like, is bonded to the wafers to be thinned through an adhesive layer so that the strength of the wafers is maintained, and occurrence of cracking and warping appearing on the wafer are prevented. Because the strength of the wafers can be secured by the wafer handling system (WHS), it is possible to automatically carry the semiconductor wafers subjected to the thinning process.

As a method for manufacturing semiconductor chips in which a support is bonded to a semiconductor wafer, the semiconductor wafer is processed, and then, the support is separated therefrom, a method described in JP-A-2004-64040 (publication date: Feb. 26, 2004) is known. In the method described in JP-A-2004-64040, a light-transmitting support and a semiconductor wafer are bonded through a photothermal conversion layer and an adhesive layer provided on the support side, the semiconductor wafer is processed, and then, radiant energy is radiated from the support side to decompose the photothermal conversion layer, whereby the semiconductor wafer is separated from the support.

SUMMARY OF THE INVENTION

However, in the technique disclosed in JP-A-2004-64040, a laminate is formed using an adhesive composition having high adhesive properties such that a substrate and a support are not stripped during a treatment. Therefore, before forming a laminate, a step of forming a release layer which is changed in quality by absorbing light on a support is required. In addition, in order to strip a support from a substrate after performing a desired treatment on the substrate, a step of changing the quality by applying light onto a release layer formed in the laminate is required.

Therefore, there is demand for a new adhesive composition which can form a laminate in which a support can be stripped from a substrate even in a case of not forming a release layer.

The present invention has been accomplished in consideration of the above-described problem, and an object of the present invention is to provide a new adhesive composition which can form a laminate in which a support can be easily stripped from a substrate even in a case of not forming a release layer.

The adhesive composition according to the present invention to solve the above problems is an adhesive composition for temporarily attaching a substrate to a support which supports the substrate, and includes a thermoplastic resin and a release agent.

According to the present invention, an effect is exhibited that a new adhesive composition which can form a laminate in which a support can be easily stripped from a substrate even in a case of not forming a release layer can be provided.

DETAILED DESCRIPTION OF THE INVENTION

Adhesive Composition

Hereinafter, an adhesive composition according to an embodiment of the present invention will be described in detail with reference to FIGS. 1A to 1E.

Figure 1A:
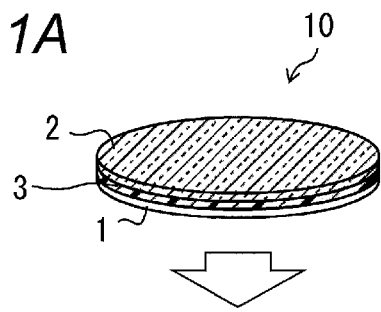
FIGS. 1A to 1E are schematic perspective views for illustrating a laminate according to an embodiment of the present invention and a stripping method including a preliminary treatment step according to an embodiment of the present invention.

The adhesive composition according an embodiment is an adhesive composition for temporarily attaching a substrate 1 to a support plate (support) 2 which supports the substrate 1, and includes a thermoplastic resin and a release agent (FIG. 1A).

According to the above configuration, it is possible to suitably adjust the adhesive properties of an adhesive layer 3 formed of the adhesive composition. Thus, it is possible to suitably attach the substrate 1 to the support plate 2 through the adhesive layer 3 when performing a desired treatment on the substrate 1. In addition, it is possible to easily strip the support plate 2 from the substrate 1 after performing a desired treatment on the substrate 1. For this reason, it is not necessary to form a release layer on the support plate 2 before attaching the substrate 1 to the support plate 2. That is, by using the adhesive composition according to an embodiment, it is possible to form a laminate in which the support plate 2 can be stripped from the substrate 1 even in a case of not forming a release layer which is changed in quality by absorbing light.

Thermoplastic Resin

A thermoplastic resin is a resin included in the adhesive composition, and adheres the substrate 1 and the support plate by the adhesive properties thereof. Hereinafter, a constitution of the thermoplastic resin included in the adhesive composition according to the embodiment will be described.

As the thermoplastic resin, for example, it is possible to use thermoplastic resins which are used in various adhesives known in the art such as an acryl-based adhesive, a novolac-based adhesive, a naphthoquinone-based adhesive, a hydrocarbon-based adhesive, a polyimide-based adhesive, and an elastomer.

Examples of the thermoplastic resin include an elastomer resin, a hydrocarbon resin, an acryl-styrene-based resin, a maleimide-based resin, and combinations of these.

The glass transition temperature (Tg) of the adhesive composition varies depending on the type or the molecular weight of the thermoplastic resin, and the type or the amount of a plasticizer or the like mixed into the adhesive composition. The type and the molecular weight of the thermoplastic resin contained in the adhesive composition can be suitably selected according to the type of the substrate or the support, and Tg of the thermoplastic resin used in the adhesive composition is preferably in a range of −60° C. to 200° C., and more preferably in a range of −25° C. to 150° C. When Tg of the thermoplastic resin used in the adhesive composition is in a range of −60° C. to 200° C., it is possible to suitably reduce the adhesive force of the adhesive layer 3 without the need for excessive energy for cooling. In addition, Tg of the adhesive layer 3 may be suitably adjusted by mixing a plasticizer, a resin with a low degree of polymerization, or the like.

Elastomer

The thermoplastic resin included in the adhesive composition according to an embodiment is preferably an elastomer.

By using an elastomer as the thermoplastic resin, it is possible to obtain an adhesive composition having high heat resistance and high resistance against a resist solvent.

An elastomer preferably includes a styrene unit as a constituent unit of a main chain, and the "styrene unit" may have a substituent. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group. In addition, the content of the styrene unit is more preferably in a range of 14% by weight to 50% by weight. Furthermore, the weight average molecular weight of the elastomer is preferably in a range of 10,000 to 200,000.

When the content of the styrene unit is in a range of 14% by weight to 50% by weight and the weight average molecular weight of an elastomer is in a range of 10,000 to 200,000, the adhesive layer can be removed more easily and quickly since the elastomer is easily dissolved in hydrocarbon-based solvents described below. In addition, when the content of the styrene unit and the weight average molecular weight of the elastomer are in the above-described ranges, excellent resistance is exhibited with respect to exposure to resist solvents (for example, propylene glycol monomethyl ether acetate (PGMEA), propylene glycol monomethyl ether (PGME), and the like), acids (hydrofluoric acid and the like), and alkalis (tetramethyl ammonium hydroxide (TMAH) and the like) to which the wafer is exposed when the wafer is subjected to a resist lithography step.

Moreover, (meth)acrylic acid ester described below may be further mixed into the elastomer.

In addition, the content of the styrene unit is more preferably in a range of 17% by weight to 40% by weight.

The weight average molecular weight is more preferably in a range of 20,000 to 150,000.

As the elastomer, various elastomers of which the content of the styrene unit is in a range of 14% by weight to 50% by weight, and of which the weight average molecular weight is in a range of 10,000 to 200,000 can be used. Examples of the elastomer include a polystyrene-poly(ethylene/propylene) block copolymer (SEP), a styrene-isoprene-styrene block copolymer (SIS), a styrene-butadiene-styrene block copolymer (SBS), a styrene-butadiene-butylene-styrene block copolymer (SBBS), and hydrogenated products thereof, a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), a styrene-ethylene-ethylene-propylene-styrene block copolymer (SEPTON V9461 (manufactured by KURARAY Co., Ltd.), SEPTON V9475 (manufactured by KURARAY Co., Ltd.)) of which the styrene block is a reaction crosslinking type, a styrene-ethylene-butylene-styrene block copolymer (having a reactive polystyrene-based hard block, SEPTON V9827 (manufactured by KURARAY Co., Ltd.)) of which the styrene block is a reaction crosslinking type, and polystyrene-poly(ethylene-ethylene/propylene) block-polystyrene block copolymer (SEEPS-OH: terminal hydroxyl group modification). Elastomers of which the content of the styrene unit and the weight average molecular weight are in the above ranges can be used.

In addition, among the above elastomers, a hydrogenated elastomer is more preferable. The hydrogenated elastomer has high stability with respect to heat, and changes in quality such as decomposition and polymerization are less likely to occur. In addition, the hydrogenated elastomer is more preferable from the viewpoint of solubility in hydrocarbon-based solvents and resistance to resist solvents.

In addition, the elastomer is more preferably a block polymer of which both terminals are blocked by styrene. This is because the elastomer exhibits higher heat resistance by blocking both terminals thereof with styrene having high heat stability.

The elastomer included in the adhesive composition according to an embodiment is more preferably a hydrogenated styrene elastomer among the above-described elastomers.

The hydrogenated styrene elastomer is a hydrogenated product of a block copolymer of styrene and conjugated diene. That is, the hydrogenated styrene elastomer has the same advantages as a hydrogenated elastomer and advantages of a block polymer.

Accordingly, by using a hydrogenated styrene elastomer as a thermoplastic resin, it is possible to further improve stability with respect to heat of the adhesive layer 3 formed of the adhesive composition, and it is possible to make changes in quality due to decomposition or polymerization of the adhesive layer 3 be less likely to occur. In addition, it is possible to enhance heat resistance of the adhesive layer 3. Furthermore, it is more preferable that a hydrogenated styrene elastomer is used as a thermoplastic resin, from the viewpoint of solubility in hydrocarbon-based solvents and resistance against resist solvents, also.

Examples of a commercially available product which can be used as the elastomer included in the adhesive constituting the adhesive layer 3 include "SEPTON (product name)" manufactured by KURARAY Co., Ltd., "HYBRAR (product name)" manufactured by KURARAY Co., Ltd., "TUFTEC (product name)" manufactured by Asahi Kasei Corporation, and "DYNARON (product name)" manufactured by JSR Corporation.

The content of the elastomer included in the adhesive constituting the adhesive layer 3 is preferably in a range of 50 parts by weight to 99 parts by weight, more preferably in a range of 60 parts by weight to 99 parts by weight, and most preferably in a range of 70 parts by weight to 95 parts by weight when the total amount of the adhesive composition is set to 100 parts by weight. When the content of the elastomer is in these ranges, it is possible to suitably bond a wafer and a support while maintaining heat resistance.

In addition, plural types of elastomer may be used in combination. In other words, the adhesive constituting the adhesive layer 3 may contain plural types of elastomer. At least one among plural types of elastomer may include the styrene unit as a constituent unit of a main chain. In addition, regarding at least one among plural types of elastomer, when the content of the styrene unit is in a range of 14% by weight to 50% by weight, or the weight average molecular weight is in a range of 10,000 to 200,000, it is in a range of the present invention. In addition, in a case where plural types of elastomer are contained in the adhesive constituting the adhesive layer 3, as a result of mixing, the content of the styrene unit may be adjusted so as to be in the above-described range. For example, when SEPTON 4033 of SEPTON (product name) manufactured by KURARAY Co., Ltd. of which the content of the styrene unit is 30% by weight and SEPTON 2063 of SEPTON (product name) of which the content of the styrene unit is 13% by weight are mixed in a weight ratio of 1:1, the content of styrene with respect to the entire elastomer included in the adhesive becomes 21% by weight to 22% by weight, and thus, becomes 14% by weight or greater. In addition, for example, when an elastomer in which there is 10% by weight of the styrene unit and an elastomer in which there is 60% by weight of the styrene unit are mixed in a weight ratio of 1:1, the content of styrene becomes 35% by weight, and thus the content is in the above-described range. The present invention may also be such a form. In addition, it is most preferable that all the plural types of elastomer included in the adhesive constituting the adhesive layer 3 contain the styrene unit in the above-described range, and the weight average molecular weight is in the above-described range.

Hydrocarbon Resin

The thermoplastic resin included in the adhesive composition according to an embodiment is more preferably a hydrocarbon resin.

By using a hydrocarbon resin as a thermoplastic resin, it is possible to form the adhesive layer 3 having higher heat resistance.

The hydrocarbon resin is a resin having a hydrocarbon skeleton and formed by polymerizing a monomer composition. Examples of the hydrocarbon resin include a cycloolefin-based polymer (hereinafter, also referred to as "resin (A)"), or at least one resin (hereinafter, also referred to as "resin (B)") selected from the group consisting of a terpene-based resin, a rosin-based resin, and a petroleum resin, but the hydrocarbon resin is not limited thereto.

The resin (A) may be a resin formed by polymerizing monomer components including cycloolefin-based monomers. Specifically, a ring-opened (co)polymer of a monomer component including the cycloolefin-based monomer and a resin obtained by addition-(co)polymerizing the monomer component including the cycloolefin-based monomer can be exemplified.

Examples of the cycloolefin-based monomer included in the monomer component constituting the resin (A) include bicyclic compounds such as norbornene and norbornadiene, tricyclic compounds such as dicyclopentadiene and hydroxydicyclopentadiene, tetracyclic compounds such as tetracyclododecene, pentacyclic compounds such as a cyclopentadiene trimer, heptacyclic compounds such as tetracyclopentadiene, or alkyl (such as methyl, ethyl, propyl, or butyl) substituents, alkenyl (such as vinyl) substituents, alkylidene (such as ethylidene) substituents, and aryl (such as phenyl, tolyl, or naphthyl) substituents of the polycyclic compounds. Among these, in particular, a norbornene-based monomer selected from the group consisting of norbornene, tetracyclododecene, or alkyl substituents thereof is preferable.

The monomer component constituting the resin (A) may contain other monomers which can be copolymerized with the above-described cycloolefin-based monomers, and preferably contains an alkene monomer, for example. Examples of the alkene monomer include ethylene, propylene, 1-butene, isobutene, 1-hexene, and α-olefin. The alkene monomer may be linear or branched.

In addition, the cycloolefin monomer is preferably contained as the monomer component constituting the resin (A) from the viewpoint of high heat resistance (poor pyrolytic properties and thermal weight loss properties). A ratio of the cycloolefin monomer with respect to all the monomer components constituting the resin (A) is preferably 5 mol % or greater, more preferably 10 mol % or greater, and still more preferably 20 mol % or greater. In addition, the ratio of the cycloolefin monomer with respect to all the monomer components constituting the resin (A), which is not particularly limited, is preferably 80 mol % or less, and more preferably 70 mol % or less from the viewpoint of solubility and exposure stability in a solution.

In addition, the monomer components constituting the resin (A) may contain linear or branched alkene monomers. A ratio of the alkene monomer with respect to all the monomer components constituting the resin (A) is preferably 10 mol % to 90 mol %, more preferably 20 mol % to 85 mol %, and still more preferably 30 mol % to 80 mol % from the viewpoint of solubility and flexibility.

Moreover, it is preferable that the resin (A), for example, is a resin having no polar group, as a resin formed by polymerizing monomer components consisting of cycloolefin-based monomers and alkene monomers, to suppress the generation of gas at high temperature.

The polymerization method and the polymerization conditions when the monomer component is polymerized are not particularly limited, and may be suitably set according to common methods.

Examples of commercially available products that can be used as the resin (A) include "TOPAS" manufactured by POLYPLASTICS Co., Ltd., "APEL" manufactured by Mitsui Chemicals, Inc., "ZEONOR" and "ZEONEX" manufactured by ZEON CORPORATION, and "ARTON" manufactured by JSR Corporation.

The glass transition temperature (Tg) of the resin (A) is preferably 60° C. or higher, and particularly preferably 70° C. or higher. In a case where the glass transition temperature of the resin (A) is 60° C. or higher, when the laminate is exposed to a high temperature environment, it is possible to further suppress softening of the adhesive layer 3.

The resin (B) is at least one resin selected from the group consisting of a terpene-based resin, a rosin-based resin, and a petroleum resin. Specifically, examples of the terpene-based resin include a terpene resin, a terpene phenol resin, a modified terpene resin, a hydrogenated terpene resin, and a hydrogenated terpene phenol resin. Examples of the rosin-based resin include rosin, rosin ester, hydrogenated rosin, hydrogenated rosin ester, polymerized rosin, polymerized rosin ester, and modified rosin. Examples of the petroleum resin include an aliphatic or aromatic petroleum resin, a hydrogenated petroleum resin, a denatured petroleum resin, an alicyclic petroleum resin, and a coumarone-indene petroleum resin. Among these, a hydrogenated terpene resin, and a hydrogenated petroleum resin are more preferable.

The softening point of the resin (B), which is not particularly limited, is preferably 80° C. to 160° C. In a case where the softening point of the resin (B) is 80° C. or higher, when the laminate is exposed to a high temperature environment, it is possible to suppress softening, and an adhesive failure does not occur. On the other hand, in a case where the softening point of the resin (B) is 160° C. or lower, when the laminate is stripped, the peeling rate becomes excellent.

The weight average molecular weight of the resin (B), which is not particularly limited, is preferably 300 to 3,000. When the weight average molecular weight of the resin (B) is 300 or greater, the heat resistance becomes sufficient, and the amount of degasification is reduced under a high temperature environment. On the other hand, in a case where the weight average molecular weight of the resin (B) is 3,000 or less, when the laminate is stripped, the peeling rate becomes excellent. Moreover, the weight average molecular weight of the resin (B) in the embodiment means a molecular weight in terms of polystyrene measured using gel permeation chromatography (GPC).

Moreover, as the resin, the resins (A) and (B) may be used in combination. By mixing, the heat resistance and the peeling rate become excellent. For example, the mixing ratio between the resin (A) and the resin (B) is preferably (A):(B)=80:20 to 55:45 (mass ratio) since the peeling rate, the heat resistance under a high temperature environment, and the flexibility are excellent at this ratio.

Acryl-Styrene-Based Resin

As the thermoplastic resin, an acryl-styrene-based resin may be used. Examples of the acryl-styrene-based resin include resins which are copolymerized using styrene or styrene derivatives, and (meth)acrylic acid esters as monomers.

Examples of the (meth)acrylic acid ester include (meth)acrylic acid alkyl esters formed of a chain structure, (meth)acrylic acid esters having an aliphatic ring, and (meth)acrylic acid esters having an aromatic ring. Examples of the (meth)acrylic acid alkyl esters formed of a chain structure include acryl-based long chain alkyl esters having an alkyl group having 15 to 20 carbon atoms, and acryl-based alkyl esters having an alkyl group having 1 to 14 carbons. Examples of the acryl-based long chain alkyl ester include alkyl esters of acrylic acid or methacrylic acid in which the alkyl group is an n-pentadecyl group, an n-hexadecyl group, an n-heptadecyl group, an n-octadecyl group, an n-nonadecyl group, or an n-eicosyl group. Moreover, the alkyl group may be branched.

Examples of the acryl-based alkyl ester having an alkyl group having 1 to 14 carbon atoms include known acryl-based alkyl esters used in an existing acryl-based adhesive. Alkyl esters of acrylic acid or methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, and a tridecyl group are exemplified.

Examples of the (meth)acrylic acid ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate, and among these, isobornyl methacrylate and dicyclopentanyl (meth)acrylate are more preferable.

The (meth)acrylic acid ester having an aromatic ring is not particularly limited, and examples of the aromatic ring include a phenyl group, a benzyl group, a tolyl group, a xylyl group, a biphenyl group, a naphthyl group, an anthracenyl group, a phenoxymethyl group, and a phenoxyethyl group. In addition, the aromatic ring may have a linear or a branched alkyl group having 1 to 5 carbon atoms. Specifically, phenoxyethyl acrylate is preferable.

Maleimide-Based Resin

As the thermoplastic resin, a maleimide-based resin may be used. Examples of the maleimide-based resin include resins obtained by polymerizing maleimides having an alkyl group such as N-methyl maleimide, N-ethyl maleimide, N-n-propyl maleimide, N-isopropyl maleimide, N-n-butyl maleimide, N-isobutyl maleimide, N-sec-butyl maleimide, N-tert-butyl maleimide, N-n-pentyl maleimide, N-n-hexyl maleimide, N-n-heptyl maleimide, N-n-octyl maleimide, N-lauryl maleimide, and N-stearyl maleimide; maleimides having an aliphatic hydrocarbon group such as N-cyclopropyl maleimide, N-cyclobutyl maleimide, N-cyclopentyl maleimide, N-cyclohexyl maleimide, N-cycloheptyl maleimide, and N-cyclooctylmaleimide; and aromatic maleimides having an aryl group such as N-phenylmaleimide, N-m-methyl phenyl maleimide, N-o-methyl phenyl maleimide, and N-p-methyl phenyl maleimide, as a monomer.

For example, it is possible to use a cycloolefin copolymer which is a copolymer having a repeating unit represented by the following formula (1) and a repeating unit represented by the following formula (2), as a resin of an adhesive component.

(Chemical formula 1)

(1)

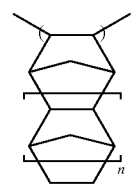
(2)

(In formula (2), n represents 0 or an integer of 1 to 3.)

As the cycloolefin copolymer, APL 8008T, APL 8009T, and APL 6013T (all manufactured by Mitsui Chemicals, Inc.) can be used.

Release Agent

The adhesive composition according to an embodiment includes a release agent. Thus, by mixing a release agent into the adhesive composition, it is possible to adjust the adhesive properties of the adhesive layer 3 with respect to the substrate 1 and the support plate 2. Thus, it is possible to obtain an adhesive composition which can form a laminate 10 in which the support plate 2 can be easily stripped from the substrate 1 after performing a desired treatment on the substrate 1.

As the release agent, for example, silicones can be mentioned. More specifically, example of the silicone include a silicone oil, and specifically, include a straight silicone oil, a modified silicone oil, a cured product of a modified silicone oil, and the like.

Straight Silicone Oil

Examples of the straight silicone oil include a dimethyl silicone oil, a methyl phenyl silicone oil, and a methyl hydrogen silicone oil. As an example of commercially available products of these straight silicone oils, products manufactured by Shin-Etsu Chemicals Co., Ltd. can be mentioned, and examples thereof include dimethyl silicone oils such as KF96-10, KF96-100, KF96-1000, KF96H-10000, KF96H-12500, and KF96H-10000; methyl phenyl silicone oils such as KF50-100, KF54, and KF56; and methyl hydrogen silicone oils such as KF99 and KF9901.

Modified Silicone Oil

The modified silicone oil is silicone modified by introducing a functional group to at least one part of the terminal and the side chain of dimethyl silicone. That is, the modified silicone oil corresponds to any one of a both terminals type modified silicone, a one terminal type modified silicone, a side chain type modified silicone, and a side chain both terminals type modified silicone.

Examples of the modified silicone oil include a compound having a polydimethylsiloxane skeleton represented by the following formulas (3) to (6).

(Chemical formula 2)

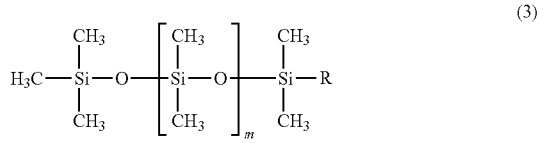

(3)

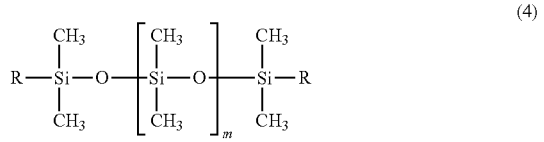

(4)

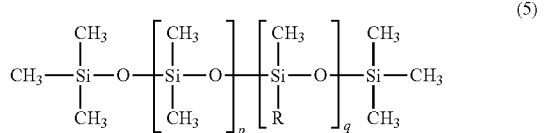

(5)

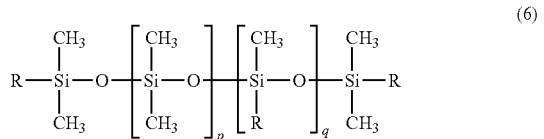

(6)

(In the formulas (3) and (4), m is an integer of 1 or greater, more preferably an integer of 10 to 1,000, and still more preferably an integer of 20 to 500. In addition, in the formulas (5) and (6), p is an integer of 1 or greater, more preferably an integer of 10 to 1,000, and still more preferably an integer from 20 to 500. q is an integer of 1 or greater, more preferably an integer of 10 to 1,000, and still more preferably an integer of 20 to 500. In addition, in the formulas (3) to (6), R represents a functional group to which a carbinol group, an epoxy group, an amino group, an acrylic group, a methacrylic group, a carboxyl group, a phenol group, a mercapto group, an alkyl group, an aralkyl group, diol, a silanol group, a polyether, a carboxylic acid anhydride, a higher fatty acid ester, higher fatty acid amide, or a methylstyryl group can be introduced. In addition, in a case of introducing a silanol group, R can be a hydroxyl group.)

In addition, in a case where R represents a functional group to which polyether can be introduced, R can be represented by the following formula (7).

(Chemical formula 3)

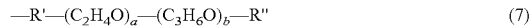

—R'—$(C_2H_4O)_a$—$(C_3H_6O)_b$—R" (7)

(In formula (7), R' represents, for example, an organic group such as an alkylene group or the like, and R' represents a linear or branched alkyl group or the like which may be substituted with a hydrogen atom, an aryl group, or a cycloalkyl group. In addition, a is an integer of 0 to 30, b is an integer of 0 to 30, and a and b satisfy a condition of 60≥a+b≥1.)

In addition, although the equivalent of the functional group of a modified silicone oil is not particularly limited, the equivalent of the functional group is, for example, 1 g/mol to 100,000 g/mol, and preferably 10 g/mol to 5,000 g/mol.

In addition, in a case where a modified silicone, for example, has been modified by a functional group to which a hydroxyl group such as a carbinol group, a phenol group, or a polyether can be introduced, the hydroxyl value of the modified silicone is preferably 20 mg KOH/g to 500 mg KOH/g.

As an example of commercially available products of these modified silicone oils, products manufactured by Shin-Etsu Chemicals Co., Ltd. can be mentioned, and examples thereof include carbinol-modified silicone oils such as X-22-4039, X-22-4015, KF6000, KF6001, KF6002, KF6003, and X-22-170DX; epoxy-modified silicone oils such as X-22-163A, X-22-163B, X-22-163C, X-22-2000, X-22-4741, KF1005, X-22-169B, and X-22-173DX; amino-modified silicone oils such as KF393, KF865, X-22-9409, X-22-3939A, and X-22-161B; acryl-modified silicone oils such as X-22-2445 and X-22-1602; methacryl-modified silicone oils such as X-22-164B and KF2012; carboxyl-modified silicone oils such as X-22-3701E and X-22-X-22-162C; phenol-modified silicone oils such as KF2200; mercapto-modified silicone oils such as KF2001 and X-22-167B; alkyl-modified silicone oils such as KF414 and KF4003; aralkyl-modified silicone oils such as KF410 and X-22-1877; diol-modified silicone oils such as X-22-176DX and X-22-176GX-A; polyether-modified silicone oils such as X-22-4272, KF945, KF6011, KF6123, and X-22-2516; and silanol terminal silicone oils such as X-21-5841 and KF9701.

The modified silicone oil can be suitably selected according to the type of the thermoplastic resin used in the adhesive composition. For example, in a case where a hydrocarbon resin and an elastomer are used as the thermoplastic resin, a silicone oil modified by introducing a functional group having high polarity such as a carbinol group, an epoxy group, an amino group, an acrylic group, a methacrylic group, a carboxyl group, a phenol group, a mercapto group, a silanol group, diol, polyether, or the like is preferably used as a release agent.

A hydrocarbon resin and an elastomer such as a hydrogenated styrene elastomer have chemical structures having low polarity. Therefore, in a case of mixing a modified silicone oil to which a functional group having high polarity has been introduced, the modified silicone oil can more suitably ooze to the surface of the adhesive layer 3. Accordingly, it is possible to obtain an adhesive composition of which the adhesive properties at both the interface between the adhesive layer 3 and the substrate 1 in the laminate 10 shown in FIG. 1A and the interface between the adhesive layer 3 and the support plate 2 can be more suitably adjusted.

That is, in a case of mixing a modified silicone oil to which a functional group having high polarity has been introduced, it is possible to suitably adjust the adhesive properties of the adhesive composition having high heat resistance including a hydrocarbon resin and an elastomer such as a hydrogenated styrene elastomer.

In addition, as the release agent, a dimethyl silicone oil or a modified silicone oil to which a functional group having low polarity such as an alkyl group, a phenyl group, or an aralkyl group has been introduced can also be used. That is, silicones such as these dimethyl silicone oil and modified silicone oil may be suitably selected and used according to the polarity or the like of the thermoplastic resin, the plasticizer, or the like used in the adhesive composition.

In the adhesive composition according to an embodiment, the kinematic viscosity of the dimethyl silicone oil or the modified silicone oil at 25° C. is preferably 20 mm$^2$/s or greater, more preferably 40 mm$^2$/s or greater, and most preferably 60 mm$^2$/s or greater. When the kinematic viscosity of the dimethyl silicone oil or the modified silicone oil at 25° C. is 20 mm$^2$/s or greater, it is possible to prevent the silicone oil from evaporating. Thus, for example, even in a case of a laminate to be treated at a high temperature of 160° C. or higher, it is possible to use the adhesive composition according to an embodiment.

In addition, the dimethyl silicone oil or the modified silicone oil is not particularly limited as long as it can be mixed into a thermoplastic resin, and a dimethyl silicone oil or a modified silicone oil having a kinematic viscosity at 25° C. of 1,000,000 mm$^2$/s or less may be used. When the dimethyl silicone oil or the modified silicone oil has a kinematic viscosity at 25° C. of 1,000,000 mm$^2$/s or less, the dimethyl silicone oil or the modified silicone oil can be suitably mixed into a thermoplastic resin, and it is possible to adjust the adhesive properties of the adhesive layer.

In addition, the mixing amount of the dimethyl silicone oil or the modified silicone oil with respect to the total amount of the thermoplastic resin may be suitably adjusted according to the type of the thermoplastic resin and the type of the release agent. Thus, for example, the release agent is preferably mixed in in a range of 0.01% by weight to 10% by weight, more preferably mixed in in a range of 0.1% by weight to 5% by weight, and most preferably mixed in in a range of 1% by weight to 3% by weight with respect to the total amount of the thermoplastic resin, however, the embodiment is not particularly limited thereto. When the dimethyl silicone oil or the modified silicone oil is mixed in in a range of 0.01% by weight to 10% by weight with respect to the total amount of the thermoplastic resin, it is possible to suitably attach the substrate 1 to the support plate 2. In addition, it is possible to obtain an adhesive composition which can form a laminate in which the support plate 2 can be easily stripped from the substrate 1 even in a case of not forming a release layer on the support plate 2.

In addition, as the release agent such as a dimethyl silicone oil or a modified silicone oil, a release agent having a specific gravity close to the specific gravity of a mixture of a thermoplastic resin and a solvent is more preferably used. Thus, it is possible to improve the dispersibility of the release agent into the adhesive composition.

Cured Product of Modified Silicone Oil

As the release agent, a cured product of a modified silicone oil may be used. By adding a cured product of a modified silicone oil into the adhesive composition, it is also possible to suitably adjust the adhesive properties of the adhesive composition.

As the cured product of a modified silicone oil, a cured product obtained by reacting a functional group introduced into a modified silicone oil with a functional group of another modified silicone oil can be exemplified. For example, a cured product obtained by reacting an amine-modified silicone oil or a mercapto-modified silicone oil with an epoxy-modified silicone oil can be mentioned.

In addition, as the cured product of a modified silicone oil, for example, a cured product obtained by reacting a catalyst-curing type or light-curing type silicone oil can be mentioned. As the catalyst-curing type silicone oil, for example, KF-705F-PS, KS-705F-PS-1, KS-770-PL-3, and the like manufactured by Shin-Etsu Chemicals Co., Ltd. can be mentioned. In addition, as the light-curing type silicone oil, for example, KS-720 and KS744-PL3 manufactured by Shin-Etsu Chemicals Co., Ltd. can be mentioned.

In addition, regarding the cured product of a modified silicone oil, for example, after obtaining a cured product by reacting isocyanate with a modified silicone oil to which a functional group having an active hydrogen such as a carbinol-modified silicone oil or an amino-modified silicone oil has been introduced, the cured product may be used as the release agent.

Other Components

The adhesive composition may further include other miscible substances other than the thermoplastic resin and the release agent in such a range that no essential feature is impaired. For example, various additives commonly used to improve performance of the adhesive such as an additive resin, a plasticizer, an adhesion auxiliary agent, a stabilizer, a colorant, a thermal polymerization inhibitor, and a surfactant can further be used. The adhesive composition may include a diluent solvent.

Diluent Solvent

The diluent solvent is used to dilute the adhesive composition. Therefore, it is possible to adjust the adhesive composition to have a viscosity suitable for conditions for coating.

Examples of the diluent solvent include linear hydrocarbons such as hexane, heptane, octane, nonane, methyloctane, decane, undecane, dodecane, and tridecane, branched hydrocarbons having 4 to 15 carbon atoms, cyclic hydrocarbons such as cyclohexane, cycloheptane, cyclooctane, naphthalene, decahydronaphthalene, and tetrahydronaphthalene, and terpene solvents such as p-menthane, o-menthane, m-menthane, diphenylmenthane, 1,4-terpine, 1,8-terpine, bornane, norbornane, pinane, thujane, carane, longifolene, geraniol, nerol, linalool, citral, citronellol, menthol, isomenthol, neomenthol, α-terpineol, β-terpineol, γ-terpineol, terpinene-1-ol, terpinene-4-ol, dihydroterpinylacetate, 1,4-cineol, 1,8-cineol, borneol, carvone, ionone, thujone, camphor, d-limonene, l-limonene, and dipentene; lactones such as γ-butyrolactone; ketones such as acetone, methyl ethyl ketone, cyclohexanone (CH), methyl-n-pentyl ketone, methyl isopentyl ketone, and 2-heptanone; polyalcohols such as ethylene glycol, diethylene glycol, propylene glycol, and dipropylene glycol; compounds having an ester bond such as ethylene glycol monoacetate, diethylene glycol monoacetate, propylene glycol monoacetate, and dipropylene glycol monoacetate, and derivatives of polyalcohols such as compounds having an ether bond such as monophenyl ethers or monoalkyl ethers such as monomethyl ether, monoethyl ether, monopropyl ether, and monobutyl ether of the polyalcohols or the compounds having the ester bond (among these, propylene glycol monomethyl ether acetate (PGMEA) and propylene glycol monomethyl ether (PGME) are preferable); cyclic ethers such as dioxane, or esters such as methyl lactate, ethyl lactate (EL), methyl acetate, ethyl acetate, butyl acetate, methoxybutyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, and butylphenyl ether.

Laminate 10

Hereinafter, the laminate 10 according to an embodiment of the present invention will be described in detail with reference to FIG. 1A. As shown in FIGS. 1A to 1E, the laminate 10 is formed by attaching the substrate 1 to the support plate 2 which supports the substrate 1 through the adhesive layer 3 formed by using the adhesive composition according to an embodiment of the present invention.

A desired treatment is performed on the substrate 1 of the laminate 10. A thinning treatment is performed on the substrate 1 such that the thickness thereof becomes 25 μm to 150 μm using a grinder or the like, as an example. In addition, after the substrate 1 is thinned to a desired thickness, circuit elements or the like are formed on the substrate 1 by performing a photolithography treatment or the like. That is, in the laminate 10 according to an embodiment, the adhesive properties of the adhesive layer 3 including a release agent are adjusted such that the substrate 1 can be suitably in close contact with the support plate 2 even in a case where force is applied to the laminate 10 or the laminate 10 is heated.

In addition, it is possible to easily strip the support plate 2 from the substrate 1 after performing a desired treatment even in a case where the laminate 10 does not have a release layer. Therefore, it is possible to perform a desired treatment on the substrate 1 without considering a chemical resistance, an adhesiveness, or the like of a release layer, as in the laminate having a release layer.

Moreover, the release layer is a layer provided between a support and an adhesive layer in a laminate, and for example, the release layer is a layer formed of an organic film such as a fluorocarbon film formed by a plasma CVD method or an inorganic film such as a metal film. The release layer is changed in quality by absorbing light, and the strength or the adhesive properties thereof are reduced, and due to this, the support is stripped from the substrate.

Substrate 1

The substrate 1 is attached to the support plate 2 through the adhesive layer 3. As the substrate 1, besides a silicon wafer substrate, any substrate such as a ceramic substrate, a thin film substrate, a flexible substrate, and the like can be used.

Support Plate 2

The support plate (support) 2 is a support which supports the substrate 1, and is attached to the substrate 1 through the adhesive layer 3. Thus, the support plate 2 may have a strength necessary to prevent the substrate 1 from being damaged or deformed at the time of performing a process such as thinning, carrying, or implementation of the substrate 1. From the viewpoints as described above, as the support plate 2, a plate formed of glass, silicon, or an acryl-based resin is exemplified.

Adhesive Layer 3

The adhesive layer 3 is a layer used for attaching the substrate 1 to the support plate 2, and is formed using the adhesive composition according to an embodiment of the present invention. The adhesive layer 3 may be formed by suitably adjusting the viscosity of the adhesive composition using a diluent solvent according to the coating method of the adhesive composition, the film thickness of the adhesive layer 3, or the like.

The adhesive layer 3 can be formed by coating the substrate 1 or the support plate 2 with the adhesive composition by a method such as a spin coating method, a dipping method, a roller blade method, a spraying coating method, or a slit coating method, for example.

The thickness of the adhesive layer 3 may be suitably set according to the type of the substrate 1 or the support plate 2 to be attached, a treatment to be performed on the substrate 1 after attaching, or the like. The thickness of the adhesive layer 3 is preferably in a range of 10 μm to 150 μm, and more preferably in a range of 15 μm to 100 μm.

Stripping Method According to First Embodiment

Hereinafter, the stripping method according to an embodiment (first embodiment) will be described in more detail with reference to FIGS. 1A to 1E. The stripping method according to the embodiment includes a preliminary treatment step (FIGS. 1A and 1B) of removing at least a part of the outer peripheral portion of the adhesive layer 3 in the laminate 10 according to an embodiment of the present invention and a stripping step (FIG. 1C) of stripping the support plate 2 from the substrate 1 in the laminate 10.

Thus, it is possible to concentrate the force applied to the laminate 10 in the stripping step to the portion at which the adhesive layer 3 in the laminate 10 has been removed in the preliminary treatment step. Accordingly, it is possible to strip the support plate 2 from the substrate 1 even in a case where excessive force is not applied to the laminate 10 in the stripping step.

Therefore, according to the stripping method of the embodiment, it is not necessary to provide a release layer which is changed in quality by absorbing light to the laminate 10.

Figure 1B:
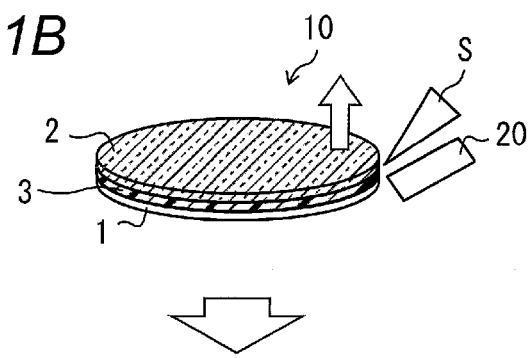
Figure 1C:
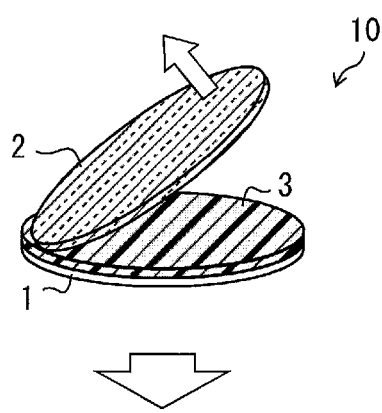
Figure 1D:
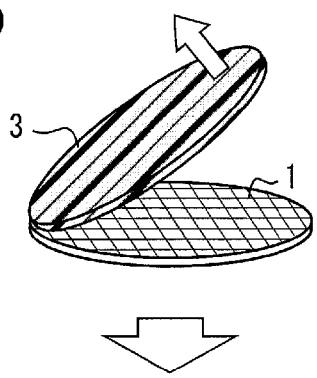
Figure 1E:
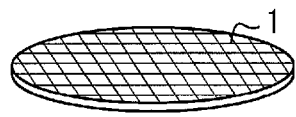

In addition, as shown in FIGS. 1D and 1E, the stripping method according to the embodiment includes an adhesive layer stripping step of stripping the adhesive layer 3 from the substrate 1 from which the support plate 2 has been stripped, after the stripping step.

Thus, it is possible to suitably remove the adhesive layer 3 from the substrate 1 from which the support plate 2 has been stripped.

Preliminary Treatment Step

The preliminary treatment step is performed after fixing the laminate 10 such that the substrate 1 of the laminate 10 is positioned on the bottom surface side (FIG. 1A). The fixation of the laminate may be performed using a stage (not shown) having a porous portion as an example.

As shown in FIG. 1B, in the preliminary treatment step according to the embodiment, an insertion member, for example, a blade 20 is inserted into at least a part of the outer peripheral portion of the adhesive layer 3 in the laminate 10. Thus, a part of the adhesive layer 3 adhered to the support plate 2 is removed.

The blade 20 is preferably inserted in the vicinity of the interface between the support plate 2 and the adhesive layer 3 of the laminate 10 shown in FIG. 1B. In addition, although the depth for inserting the blade 20 into the adhesive layer 3 is not limited, the depth is preferably at least 2 mm or greater from the end portion of the outer peripheral portion of the adhesive layer 3, and more preferably 2 mm to 10 mm.

Then, by the blade 20, a stripping solvent S is supplied to a portion at which the adhesive layer 3 has been removed. Thus, the adhesive properties of the portion at which a part of the adhesive layer 3 in the laminate 10 has been removed are reduced.

In the preliminary treatment step, the amount of the stripping solvent S supplied to the portion at which the adhesive layer 3 in the laminate 10 has been removed may be suitably adjusted according to the size or the like of the laminate, and although the amount is not limited, an amount of at least 10 ml of the stripping solvent S may be supplied to the portion at which the adhesive layer 3 has been removed, and more preferably, an amount in a range of 10 ml to 50 ml of the stripping solvent S is supplied to the portion at which the adhesive layer 3 has been removed. By supplying at least 10 ml of the stripping solvent S to the portion at which the adhesive layer 3 has been removed, it is possible to more suitably reduce the adhesive properties of the adhesive layer 3. Moreover, the supply of the stripping solvent S to the adhesive layer 3 can be performed using known means such as a spray nozzle, a dispensing nozzle, or a two-fluid nozzle.

In the preliminary treatment step, the stripping solvent S may be supplied to the adhesive layer 3 to the extent that it is possible to reduce the adhesive properties of the portion at which the adhesive layer 3 has been removed. That is, the stripping solvent is supplied to the laminate until the support plate is stripped from the substrate, and it is not necessary to dissolve the adhesive layer.

Stripping Solvent

The stripping solvent is a solvent supplied to the portion at which the adhesive layer 3 in the laminate 10 has been removed in the preliminary treatment step, and is used to reduce the adhesive properties of the adhesive layer 3. The stripping solvent may be suitably selected according to the type of the thermoplastic resin or the release agent included in the adhesive layer 3, and although the stripping solvent is not limited, the above-described diluent solvents or the following solvents can be used.

Examples of the stripping solvent include alcohols such as methanol, ethanol, 1-propanol, 2-propanol, 1-butanol, and 2-butanol; lactones such as γ-butyrolactone; ketones such as acetone, methyl ethyl ketone (MEK), cyclohexanone (CH), methyl-n-pentyl ketone, methyl isopentyl ketone, and 2-heptanone; polyalcohols such as ethylene glycol, diethylene glycol, propylene glycol, and dipropylene glycol; compounds having an ester bond such as ethylene glycol monoacetate, diethylene glycol monoacetate, propylene glycol monoacetate, and dipropylene glycol monoacetate, and derivatives of polyalcohols such as compounds having an ether bond such as monophenyl ether or monoalkyl ethers such as monomethyl ether, monoethyl ether, monopropyl ether, and monobutyl ether of the polyalcohols or the compounds having the ester bond (among these, propylene glycol monomethyl ether acetate (PGMEA) and propylene glycol monomethyl ether (PGME) are preferable); cyclic ethers such as dioxane, esters such as methyl lactate, ethyl lactate (EL), methyl acetate, ethyl acetate, butyl acetate, methoxy butyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, and butylphenyl ether.

Stripping Step

As shown in FIG. 1C, in the stripping step, the laminate 10 is fixed such that the substrate 1 is positioned on the bottom surface side, and the support plate 2 is stripped from the substrate 1 in the laminate 10 by applying force to the support plate 2 positioned on the upper surface side of the laminate 10.

Here, since a part of the adhesive layer 3 adhered to the support plate 2, in the laminate 10 is removed by the preliminary treatment step, the force applied to the support plate 2 of the laminate 10 is concentrated on the portion at which the adhesive layer 3 has been removed. In addition, the adhesive properties of the portion at which the adhesive layer 3 has been removed in the preliminary treatment step are reduced by the stripping solvent. Therefore, it is possible to more suitably concentrate the force applied to the support plate 2 of the laminate 10 on the portion at which the adhesive layer 3 has been removed. In addition, in a case of removing the adhesive layer 3 to a depth of at least 2 mm or greater from the end portion of the outer peripheral portion of the adhesive layer 3 in the preliminary treatment step, it is possible to more suitably concentrate the force applied in the stripping step to the portion at which the adhesive layer 3 has been removed.

In addition, the stripping method according to the embodiment is suitably performed with respect to the laminate 10 according to an embodiment. Here, the adhesive layer 3 of the laminate 10 is formed of the adhesive composition including a release agent, and the adhesive properties of an adhesive layer 3 are adjusted. Thus, it is possible to easily strip the support plate 2 from the substrate 1 even in a case where excessive force is not applied to the laminate 10.

In addition, since the laminate 10 includes a release agent in the adhesive layer 3, the support plate 2 is stripped from the substrate 1 at the interface with the adhesive layer 3. Therefore, it is possible to omit washing of the support plate 2, or to reduce the amount of a solvent for washing the support plate 2.

Stripping Apparatus

The stripping method according to the embodiment can be performed using a general stripping apparatus. For example, the stripping apparatus may have at least a stage (not shown) for fixing the laminate 10 and a release plate (not shown) for applying force to the laminate 10. The stage can be a porous portion for fixing the laminate 10 by suction using decompression means, as an example. In addition, the release plate may preferably have a plurality of clamps capable of grasping the support plate 2, as an example. In addition, the release plate more preferably has a floating joint.

In the stripping step, preferably, for example, on the stage, the laminate 10 is fixed such that the substrate 1 is positioned on the bottom surface side, the chamfered portion of the outer peripheral portion of the support plate 2 is gripped by the release plate having a plurality of clamps, and force may be applied to the laminate 10 by elevating the release plate.

In addition, in the stripping step, it is more preferable to apply force to the laminate 10 from the release plate through the floating joint or the like that moves so as to take a parallel circular orbit with respect to the plane of the laminate 10 or an arc shape trajectory perpendicular with respect to the plane of the laminate 10.

In a case of applying force to the laminate 10 from the release plate through the floating joint, when the force is concentrated to the portion at which the adhesive layer 3 has been removed, the floating joint moves, the release plate is tilted, and as a result, the support plate 2 is tilted. Thus, it is possible to prevent excessive force from being applied to a part of the support plate 2 and the substrate 1. Accordingly, it is possible to more suitably strip the support plate 2 from the substrate 1 while preventing the support plate 2 and the substrate 1 from being damaged by excessive force.

Moreover, according to the stripping method of an embodiment of the present invention, it goes without saying that a release layer forming apparatus for forming a release layer in the laminate is not required.

Adhesive Layer Stripping Step

As shown in FIGS. 1D and 1E, the stripping method according to an embodiment includes an adhesive layer stripping step of stripping the adhesive layer 3 remaining on the substrate 1, after the stripping step.

The laminate 10 includes a release agent in the adhesive layer 3. Thus, in a case of cooling the adhesive layer 3 to a temperature lower than the glass transition temperature of a thermoplastic resin, it is possible to strip the adhesive layer 3 from the substrate 1 in a state where the film form is maintained (FIG. 1D). That is, even in a case of not dissolving the adhesive layer 3 with a large amount of solvent, it is possible to remove the adhesive layer 3 remaining on the substrate 1 (FIG. 1E). Therefore, it is possible to omit washing of the substrate 1, or to reduce the amount of the solvent to be used in washing the substrate 1.

Then, the residue of the adhesive layer 3 remaining on the surface of the substrate 1 is removed by washing, and a desired treatment may be performed on the substrate 1. For example, after the support plate 2 is separated, the substrate 1 is washed, and it is possible to manufacture a semiconductor chip from the substrate 1 by dicing.

According to the stripping method of the embodiment, in a case of using the stripping solvent to the extent that the adhesive properties of the adhesive layer 3 in the laminate 10 are reduced in the preliminary treatment step, it is possible to easily strip the support plate 2 from the substrate 1. In addition, it is possible to strip the adhesive layer 3 in a state of a film form from the substrate 1 and the support plate 2. Therefore, according to the stripping method of the embodiment, it is possible to reduce the amount of the solvent used compared to a method in which the support plate is stripped from the substrate by dissolving the adhesive layer with a solvent.

Stripping Method According to Second Embodiment

The stripping method according to the present invention is not limited to the above-described embodiment (first embodiment). For example, the stripping method according to an embodiment (second embodiment) includes a light irradiation step (FIGS. 2A and 2B) of irradiating at least a part of the outer peripheral portion of the adhesive layer 3 in a laminate 11 according to the embodiment of the present invention with light (laser) and a stripping step (FIG. 2C) of stripping a support plate 2a from the substrate 1 in the laminate 11. That is, in the stripping method according to the embodiment, the light irradiation step is performed instead of the above-described preliminary treatment step. Moreover, since the stripping step (FIG. 2C) and the adhesive layer stripping step (FIGS. 2D and 2E) which are performed after the light irradiation step are the same as those in the first embodiment, the description will not be repeated.

Light Irradiation Step

Figure 2A:
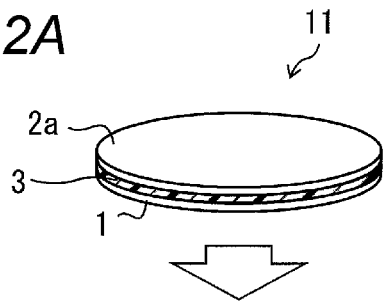
FIGS. 2A to 2E are schematic perspective views for illustrating a laminate according to an embodiment of the present invention and a stripping method including a light irradiation step according to an embodiment of the present invention.

As shown in FIG. 2A, in the stripping method according to the embodiment, the laminate 11 is formed by using the support plate 2a formed of silicon. Since the laminate 11 has the support plate 2a formed of silicon, for example, the laminate 11 can suitably transmit infrared rays such as a carbon dioxide laser.

In addition, coefficients of thermal expansion of the support plate 2a formed of silicon and the substrate 1 can be adjusted to be substantially equal. Therefore, for example, in the laminate 11, even in the case of treating the laminate 11 at a high temperature in a CVD treatment or the like, it is possible to suitably prevent distortion of the substrate 1 due to the difference in coefficients of thermal expansion between the support plate 2a and the substrate 1.

Moreover, even in the case of using glass as the support plate, it is possible to suitably transmit infrared rays such as a carbon dioxide laser from the substrate 1 side. That is, by the irradiation with the infrared rays from the substrate 1 side, it is possible to use a support plate formed of glass as the support plate 2a instead of the support plate formed of silicon.

Moreover, since the adhesive layer 3 includes silicone as a release agent, light can be absorbed in the siloxane structure of the silicone.

Figure 2B:
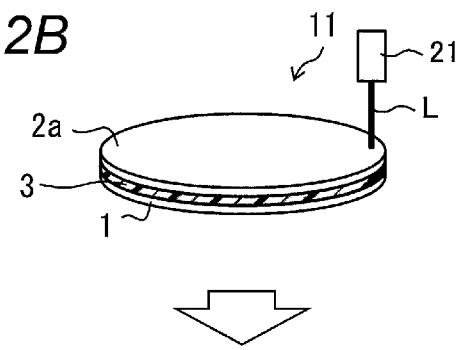
Figure 2C:
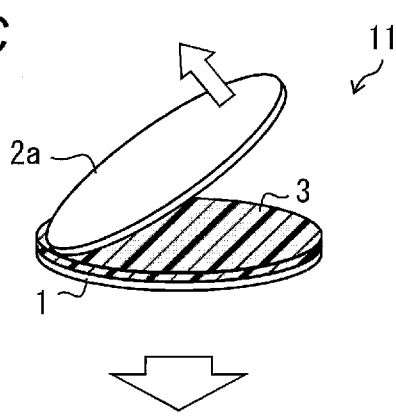
Figure 2D:
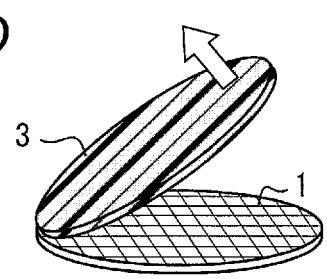
Figure 2E:
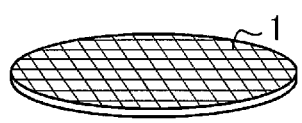

As shown in FIG. 2B, in the light irradiation step, irradiation with light L is performed toward at least part of the outer peripheral portion of the adhesive layer 3 from the support plate 2a side in the laminate 11 using a carbon dioxide laser irradiation apparatus 21. Thus, it is possible to irradiate the adhesive layer 3 at the outer peripheral portion of the laminate 11 with the light (infrared rays) which was transmitted through the support plate 2a. Thus, the infrared rays are absorbed in the adhesive layer 3 in the laminate 11, and by the energy, the adhesive layer 3 including silicone is changed in quality, and thus, it is possible to reduce the adhesive force between the support plate 2a and the adhesive layer 3.

Moreover, in the specification, "the adhesive layer 3 including silicone is changed in quality" means a phenomenon in which the adhesive layer including silicone becomes in a state in which the adhesive layer can be broken by a slight external force (for example, about 0.1 kgf to 5 kgf) or in a state in which the adhesive force between the adhesive layer including silicone and the layers in contact therewith is reduced. As a result of change in quality of the adhesive layer including silicone generated by absorbing light, the adhesive layer including silicone loses the strength or the adhesive properties before being irradiated with light. That is, by absorbing light, the adhesive layer including silicone become brittle. "Change in quality of the adhesive layer including silicone" can be that, in the substances constituting the adhesive layer including silicone, decomposition by the energy of the light absorbed, change in the steric configuration thereof, or dissociation of the functional group thereof occurs. The change in quality of the adhesive layer including silicone is generated as a result of absorption of light by the silicone. Thus, it is possible to apply force to the substrate and the support plate so as to concentrate the force on the peripheral portion in which the adhesive layer became brittle by irradiating the peripheral portion of the adhesive layer including silicone in the laminate with light. Thus, it is possible to suitably separate the support plate from the substrate.

Moreover, as the above-described preliminary treatment step, the light irradiation step is performed at a state in which the laminate 11 is fixed, and also, the same fixing method and the fixing apparatus as those in the preliminary treatment step described above can be used.

Irradiation with Light

Typical examples of the laser for emitting light for irradiation of at least a portion of the adhesive layer 3 include infrared rays (0.78 μm to 1000 μm), preferably far infrared rays (3 μm to 1000 μm), and more preferably light having a wavelength of 9 μm to 11 μm. Specifically, the laser is a $CO_2$ laser. By using the $CO_2$ laser, the $CO_2$ laser can be absorbed in the adhesive layer 3. This is because the adhesive layer 3 includes a release agent (for example, silicone oil or the like), and the release agent has a Si—O bond, and thus, the adhesive layer 3 absorbs infrared rays such as the $CO_2$ laser.

Thus, by irradiating with infrared rays such as the $CO_2$ laser, it is possible to change the adhesive layer 3 including silicone in quality, and it is possible to make the adhesive layer 3 brittle.

As the conditions of laser irradiation in the light irradiation step, the average output value of the laser is preferably 1.0 W to 50.0 W, and more preferably at 3.0 W to 40.0 W. The repetition frequency of the laser is preferably 20 kHz to 60 kHz, and more preferably 30 kHz to 50 kHz. The scanning speed of the laser is preferably 100 mm/s to 10,000 mm/s, and more preferably 100 mm/s to 1000 mm/s. Thus, it is possible to set the irradiation conditions of the laser to the suitable conditions for changing at least a portion of the adhesive layer 3 in quality. In addition, the beam spot diameter of continuous light and the irradiation pitch of continuous light may be a beam spot diameter with which adjacent beam spots are not overlapped with each other and a pitch which is capable of changing at least a portion of the adhesive layer 3 in quality.

In addition, in the light irradiation step included in the stripping method according to the embodiment, it is preferable to irradiate the adhesive layer 3 adhered to a position within a range of 10 mm or less, toward the inside, with light, it is more preferable to irradiate the adhesive layer 3 adhered to a position within a range of 5 mm or less with light, and it is most preferable to irradiate the adhesive layer 3 adhered to a position within a range of 2 mm or less with light, toward the inside from the end portion of the peripheral portion in the support plate 2a toward the inside. Thus, when separating the substrate 1 and the support plate 2a, it is possible to concentrate the force on the outer peripheral portion of the adhesive layer 3 in which the adhesive force of the outer peripheral portion of the laminate 11 was reduced. In addition, as a result, it is possible to avoid damaging the element formed inside the substrate 1 due to the light which was transmitted through the support plate 2a and the adhesive layer 3. Moreover, the light irradiation step can also be performed by irradiating the adhesive layer 3 with light toward the inside from the substrate 1 side.

Stripping Method According to Other Embodiments

The stripping method according to the embodiment of the present invention is not limited to the above-described embodiment. For example, in the stripping method according to an embodiment, in the light irradiation step included in the stripping method according to the second embodiment, a configuration in which using the laminate 10, irradiation is performed with light toward the adhesive layer 3 from the outer peripheral portion of the laminate 10 is included.

According to the above configuration, since the adhesive layer 3 includes silicone as a release agent, light can be absorbed in the adhesive layer 3 by irradiating the outer peripheral portion of the adhesive layer 3 with light without light transmitted through the substrate 1 or the support plate 2 in the laminate 10. Thus, it is possible to reduce the adhesive force between the support plate 2 and the adhesive layer 3. Moreover, it is also possible to strip the substrate 1 from the laminate 10 in the same manner.

The stripping method according to the present invention is not limited to the above-described embodiment. For example, in the stripping method according to an embodiment, in the preliminary treatment step, it is also possible to perform an embodiment in which supply of a stripping solvent to the outer peripheral portion of the adhesive layer in the laminate is not performed. Whether or not to supply a stripping solvent may be determined according to the adhesive properties of the adhesive composition according to an embodiment for forming a laminate.

When the support plate 2 is stripped from the substrate 1, for example, by adjusting the adhesive properties of the adhesive layer 3 such that a stripping strength lower than 1.5 kgf can be achieved, it is possible to omit the supply of the stripping solution in the preliminary treatment step.

In addition, in another embodiment, the stripping method may be a form that does not contain an adhesive layer stripping step. According to the type of the substrate or the adhesive composition, the adhesive layer 3 may be suitably removed by washing solution from the substrate 1 after the support plate 2 is stripped.

In addition, in another embodiment, the support plate 2 is fixed to the stage, and then, force may be applied to the substrate 1. Thus, it is possible to easily strip the support plate 2 from the substrate 1.

The present invention is not limited to each embodiment described above, and may be altered within the scope of the claims. That is, an embodiment derived from a suitable combination of technical means disclosed in different embodiments is included in the technical scope of the present invention.

EXAMPLES

Preparation of Adhesive Composition

First, as Examples 1 to 35, adhesive compositions of different types of adhesives, different types and different mixing amounts of release agents were prepared. In addition, as Comparative Examples 1 to 5, adhesive compositions not including a release agent were prepared.

Examples of the resins used as a thermoplastic resin of the adhesive composition include TUFTEC (product name) H1051 (SEBS: hydrogenated styrene-based thermoplastic elastomer: styrene content of 42%, Mw=78,000) manufactured by Asahi Kasei Corporation, SEPTON 2002 (SEPS: styrene-isoprene-styrene block), SEPTON 8004 (SEP: polystyrene-poly (ethylene/propylene) block), and SEPTON V9827 (reaction crosslinking type styrene-ethylene-butylene-styrene block copolymer) of SEPTON (product name) manufactured by KURARAY Co., Ltd., TOPAS (product name)™ (cycloolefin copolymers: copolymer of ethylene-norbornene, Mw=10,000, Mw/Mn=2.08, norbornene:ethylene=50:50 (weight ratio)) manufactured by POLYPLASTICS Co., Ltd., and APL 8008T (cycloolefin copolymer, ethylene:tetracyclododecene=80:20 copolymer), and acryl-based copolymer A1 (copolymer of styrene/dicyclopentanyl methacrylate/stearyl methacrylate=20/60/20 (weight ratio), molecular weight 10000) manufactured by Mitsui Chemicals, Inc.

In addition, as a thermal polymerization inhibitor (additive), "IRGANOX (product name) 1010" manufactured by BASF Corp. was used. In addition, as a main solvent, decahydronaphthalene was used. In addition, as an entrainer, butyl acetate was used.

Manufacturing Method 1

First, a thermoplastic resin obtained by mixing H1051, SEPTON 2002, and TOPAS™ in a weight ratio of 55:45:10 was dissolved in a solvent having a weight ratio of decahydronaphthalene:butyl acetate of 15:1 such that the concentration became 28% by weight. Then, IRGANOX 1010 was added thereto so as to constitute 1% by weight with respect to the solid content of the thermoplastic resin, whereby an adhesive composition A was obtained.

Then, release agents were mixed with the adhesive composition A according to the types and mixing amounts of the release agents shown in Table 1, whereby the adhesive compositions of Examples 1 to 11 were prepared. Moreover, the mixing amounts of the release agents shown in Table 1 are represented in a weight ratio of the resin solid content in the adhesive composition A. In addition, an adhesive composition A not including a release agent was prepared as a Comparative Example 1.

TABLE 1

|  | Adhesive composition | Release agent Type | Mixing amount |
|---|---|---|---|
| Example 1 | A | KF-6003 | 1% |
| Example 2 | A | KF-6003 | 3% |
| Example 3 | A | KF-6000 | 3% |
| Example 4 | A | KF-6001 | 3% |
| Example 5 | A | KF-6002 | 3% |
| Example 6 | A | X-22-4039 | 3% |
| Example 7 | A | X-22-163A | 3% |
| Example 8 | A | X-22-163B | 3% |
| Example 9 | A | X-22-163C | 3% |
| Example 10 | A | X-22-4272 | 3% |
| Example 11 | A | KF-6123 | 3% |
| Comparative Example 1 | A | — | — |

The following Table 2 shows the details including various physical properties of the release agents used in Examples 1 to 11. Moreover, the release agents from KF-6003 to KF-6123 in Table 2 are products manufactured by Shin-Etsu Chemicals Co., Ltd.

TABLE 2

| Release agent | Modified type | Kinematic viscosity [mm$^2$/s] | Specific gravity [g/cm$^3$] | Hydroxyl value [mg KOH/g] | Equivalent of functional group [g/mol] |
|---|---|---|---|---|---|
| KF-6000 | Both terminal carbinol | 35 | 0.98 | 120 | — |
| KF-6001 | Both terminal carbinol | 45 | 0.98 | 62 | — |
| KF-6002 | Both terminal carbinol | 70 | 0.98 | 35 | — |
| KF-6003 | Both terminal carbinol | 110 | 0.98 | 22 | — |
| X-22-4039 | Side chain carbinol | 90 | 0.99 | 58 | — |
| X-22-163A | Both terminal epoxy | 30 | 0.98 | — | 1000 |
| X-22-163B | Both terminal epoxy | 60 | 0.98 | — | 1750 |
| X-22-163C | Both terminal epoxy | 120 | 0.98 | — | 2700 |
| X-22-4272 | Both terminal polyether | 270 | 1.02 | 50 | — |
| KF-6123 | Both terminal polyether | 420 | 1.03 | 50 | — |

Manufacturing Example 2

First, a thermoplastic resin obtained by mixing SEPTON V9827, SEPTON 52002, TOPAS™, and acryl-based copolymer A1 in the weight ratio of 50:20:15:15 was dissolved in a solvent having a weight ratio of decahydronaphthalene:butyl acetate of 15:1 such that the concentration became 28% by weight. Then, IRGANOX 1010 was added thereto so as to constitute 1% by weight with respect to the solid content of the thermoplastic resin, whereby an adhesive composition B was obtained.

Then, release agents were mixed with the adhesive composition B according to the types and mixing amounts of the release agents shown in Table 3, whereby the adhesive compositions of Examples 12 to 17 were prepared. Moreover, the mixing amounts of the release agents shown in Table 3 are represented in a weight ratio of the resin solid content in the adhesive composition B. In addition, an adhesive composition B not including a release agent was prepared as a Comparative Example 2.

TABLE 3

|  | Adhesive composition | Release agent Type | Mixing amount |
|---|---|---|---|
| Example 12 | B | KF-6003 | 1% |
| Example 13 | B | KF-6003 | 3% |
| Example 14 | B | KF-6000 | 3% |
| Example 15 | B | KF-6001 | 3% |
| Example 16 | B | KF-6002 | 3% |
| Example 17 | B | X-22-4039 | 3% |
| Comparative Example 2 | B | — | — |

The details including various physical properties of the release agents used in Examples 12 to 17 are the same as those described in Table 2.

Manufacturing Example 3

First, a thermoplastic resin obtained by mixing TUFTEC H1051, SEPTON 52002, TOPAS™, and acryl-based copolymer A1 in the weight ratio of 52:26:11:11 was dissolved in a solvent having a weight ratio of decahydronaphthalene:butyl acetate of 15:1 such that the concentration became 28% by weight. Then, IRGANOX 1010 was added thereto so as to constitute 1% by weight with respect to the solid content of the thermoplastic resin, whereby an adhesive composition C was obtained.

Then, release agents were mixed with the adhesive composition C according to the types and mixing amounts of the release agents shown in Table 4, whereby the adhesive compositions of Examples 18 to 23 were prepared. Moreover, the mixing amounts of the release agents shown in Table 4 are represented in a weight ratio of the resin solid content in the adhesive composition C. In addition, an adhesive composition C not including a release agent was prepared as a Comparative Example 3.

TABLE 4

|  | Adhesive composition | Release agent Type | Mixing amount |
|---|---|---|---|
| Example 18 | C | KF-6003 | 1% |
| Example 19 | C | KF-6003 | 3% |
| Example 20 | C | KF-6000 | 3% |
| Example 21 | C | KF-6001 | 3% |
| Example 22 | C | KF-6002 | 3% |
| Example 23 | C | X-22-4039 | 3% |
| Comparative Example 3 | C | — | — |

The details including various physical properties of the release agents used in Examples 18 to 23 are also the same as those described in Table 2.

Manufacturing Example 4

SEPTON 8004 which is a thermoplastic resin was dissolved in a solvent having a weight ratio of decahydronaphthalene:butyl acetate of 15:1 such that the concentration became 28% by weight. Then, IRGANOX 1010 was added thereto so as to constitute 1% by weight with respect to the solid content of the thermoplastic resin, whereby an adhesive composition D was obtained.

Then, release agents were mixed with the adhesive composition D according to the types and mixing amounts of the release agents shown in Table 5, whereby the adhesive compositions of Examples 24 to 29 were prepared. Moreover, the mixing amounts of the release agents shown in Table 5 are represented in a weight ratio of the resin solid content in the adhesive composition D. In addition, an adhesive composition D not including a release agent was prepared as a Comparative Example 4.

TABLE 5

| | Adhesive composition | Release agent Type | Mixing amount |
|---|---|---|---|
| Example 24 | D | KF-6003 | 1% |
| Example 25 | D | KF-6003 | 3% |
| Example 26 | D | KF-6000 | 3% |
| Example 27 | D | KF-6001 | 3% |
| Example 28 | D | KF-6002 | 3% |
| Example 29 | D | X-22-4039 | 3% |
| Comparative Example 4 | D | — | — |

The details including various physical properties of the release agents used in Examples 24 to 29 are also the same as those described in Table 2.

Manufacturing Example 5

APL 8008T which is a thermoplastic resin was dissolved in a solvent having a weight ratio of decahydronaphthalene: butyl acetate of 15:1 such that the concentration became 28% by weight. Then, IRGANOX 1010 was added thereto so as to constitute 1% by weight with respect to the solid content of the thermoplastic resin, whereby an adhesive composition E was obtained.

Then, release agents were mixed with the adhesive composition E according to the types and mixing amounts of the release agents shown in Table 6, whereby the adhesive compositions of Examples 30 to 35 were prepared. Moreover, the mixing amounts of the release agents shown in Table 6 are represented in a weight ratio of the resin solid content in the adhesive composition E. In addition, an adhesive composition E not including a release agent was prepared as a Comparative Example 5.

TABLE 6

| | Adhesive composition | Release agent Type | Mixing amount |
|---|---|---|---|
| Example 30 | E | KF-6003 | 1% |
| Example 31 | E | KF-6003 | 3% |
| Example 32 | E | KF-6000 | 3% |
| Example 33 | E | KF-6001 | 3% |
| Example 34 | E | KF-6002 | 3% |
| Example 35 | E | X-22-4039 | 3% |
| Comparative Example 5 | E | — | — |

The details including various physical properties of the release agents used in Examples 30 to 35 are also the same as those described in Table 2.

Subsequently, by using the adhesive compositions of Examples 1 to 35 and Comparative Examples 1 to 5, in each step from coating of the adhesive composition to stripping of the support, the coating properties of the adhesive composition, the attachability of the support, the adhesiveness, and the stripping properties were evaluated.

Evaluation of Coating Properties of Adhesive Composition

After forming adhesive layers by coating the adhesive compositions of Examples 1 to 35 and Comparative Examples 1 to 5 on substrates, evaluation of the coating properties was performed on each adhesive composition.

First, the adhesive composition of Example 1 was spin-coated on a semiconductor wafer substrate (12 inches, silicon), and baked at the temperatures of 90° C., 160° C., and 220° C. for 4 minutes respectively, whereby an adhesive layer was formed (thickness of 50 µm). Then, while rotating the semiconductor wafer substrate on which the adhesive layer was formed at 1,500 rpm, by supplying TZNR (registered trademark) HC thinner (manufactured by Tokyo Ohka Kogyo Co., LTD.) at a supply rate of 10 cc/min with an EBR nozzle for 5 to 15 minutes, the adhesive layer was removed from the outer peripheral portion of the adhesive layer formed on the outer peripheral portion of the semiconductor wafer substrate to 1.3 mm toward the inside on the basis of the end portion of the semiconductor wafer substrate. In addition, in the same procedure, adhesive layers of Examples 2 to 35 and Comparative Examples 1 to 5 were formed on substrates.

Then, evaluation of the coating properties was performed on Examples 1 to 35 and Comparative Examples 1 to 5. The coating properties were evaluated by the presence or absence of white smoke at the time when the adhesive layer formed on the semiconductor wafer substrate was applied. The coating properties were visually evaluated, and when the adhesive composition was applied on the semiconductor wafer substrate, and then baked at a temperature of 90° C., 160° C., and 220° C. for 4 minutes, respectively, a case where white smoke was not generated from the adhesive layer formed on the semiconductor wafer substrate was evaluated as "A", and a case where white smoke was generated was evaluated as "C". Moreover, in a case where the heat resistance of the release agent was not sufficient, the adhesive layer was decomposed during baking and this was observed as white smoke.

Production of Laminate and Evaluation of Attachability

Subsequently, by using the semiconductor wafer substrates on which adhesive layers were formed of the adhesive compositions of Examples 1 to 35 and Comparative Examples 1 to 5, laminates were produced. Then, evaluation of the attachability was performed on each laminate.

First, for the semiconductor wafer substrate coated with the adhesive composition of Example 1, the semiconductor wafer substrate, the adhesive layer, and the support were superposed in this order, and the support and the semiconductor wafer substrate were attached by being pressed for 2 minutes by an attaching pressure of 4,000 kgf in vacuum (5 Pa) under condition of 215° C. Moreover, as the above-described support, a glass support having a size of 12 inches was used. In addition, in the same procedure, laminates of Examples 2 to 35 and Comparative Examples 1 to 5 were produced.

Then, attachability of each laminate of Examples 1 to 35 and Comparative Examples 1 to 5 was evaluated. The attachability was visually evaluated, and a laminate in which an unadhered portion such as a void or the like was not present was evaluated as "A", and a laminate in which an unadhered portion was present was evaluated as "C".

Evaluation of Adhesiveness after Back Grinding Treatment

Subsequently, the rear surfaces of the semiconductor wafer substrates in the laminates of Examples 1 to 35 and Comparative Examples 1 to 5 were thinned until the thickness of the semiconductor wafer substrate became 50 μm using a back grinding apparatus manufactured by DISCO Corporation (back grinding treatment: BG treatment). Then, regarding each laminate, adhesiveness of the support after the BG treatment was evaluated. The adhesiveness was visually evaluated, and a laminate in which stripping of the support was not observed was evaluated as "A", and a laminate in which stripping was observed was evaluated as "C".

Evaluation of Heat Resistance by CVD Treatment

Subsequently, a plasma CVD treatment using $N_2$ was performed on the laminates of Examples 1 to 35 and Comparative Examples 1 to 5 which had been subjected to the BG treatment at 220° C. for 10 minutes. Then, evaluation of the heat resistance was performed on each laminate. The heat resistance was visually evaluated, and a laminate in which protrusion of the adhesive layer at the edge portion of the laminate or an unadhered portion such as a void or the like between the laminates was not present was evaluated as "A", and a laminate in which protrusion or an unadhered portion was present was evaluated as "C".

Evaluation of Stripping Properties

Subsequently, the preliminary treatment step and the stripping step were performed on the laminates of Examples 1 to 35 and Comparative Examples 1 to 5 which had been subjected to the plasma CVD treatment, and evaluation of the stripping properties was performed.

First, a blade was inserted to a depth of 2 mm from the end portion of the outer peripheral portion of the laminate of Example 1, and then, by supplying 10 ml of ethanol as a stripping solvent to the portion in the laminate where the blade was inserted, the preliminary treatment step was performed. Then, using TWR 12000 series (manufactured by Tokyo Ohka Kogyo Co., Ltd.) as a supporting member separation apparatus, the semiconductor wafer substrate side was fixed, and force was applied on the support side, and thus the stripping step was performed. In the evaluation of the stripping properties, a laminate in which the glass support could be stripped from the semiconductor wafer substrate was evaluated as "A", and a laminate in which the support could not be stripped was evaluated as "C". In addition, in the same procedure, evaluation of the stripping properties was performed on the laminates of Examples 2 to 35 and Comparative Examples 1 to 5.

Evaluation Results

The evaluation results of the coating properties, the attachability, the adhesiveness, the heat resistance, and the stripping properties in Examples 1 to 35 and Comparative Examples 1 to 5 are shown in the following Tables 7 to 11.

TABLE 7

|  | Coating properties | Attachability | Adhesiveness BG | Heat resistance 220° C. CVD 10 minutes | Stripping properties |
| --- | --- | --- | --- | --- | --- |
| Example 1 | A | A | A | A | A |
| Example 2 | A | A | A | A | A |
| Example 3 | A | A | A | A | A |
| Example 4 | A | A | A | A | A |
| Example 5 | A | A | A | A | A |
| Example 6 | A | A | A | A | A |
| Example 7 | A | A | A | A | A |
| Example 8 | A | A | A | A | A |
| Example 9 | A | A | A | A | A |
| Example 10 | A | A | A | A | A |
| Example 11 | A | A | A | A | A |
| Comparative Example 1 | A | A | A | A | C |

TABLE 8

|  | Coating properties | Attachability | Adhesiveness BG | Heat resistance 220° C. CVD 10 minutes | Stripping properties |
| --- | --- | --- | --- | --- | --- |
| Example 12 | A | A | A | A | A |
| Example 13 | A | A | A | A | A |
| Example 14 | A | A | A | A | A |
| Example 15 | A | A | A | A | A |

TABLE 8-continued

|  | Coating properties | Attachability | Adhesiveness BG | Heat resistance 220° C. CVD 10 minutes | Stripping properties |
|---|---|---|---|---|---|
| Example 16 | A | A | A | A | A |
| Example 17 | A | A | A | A | A |
| Comparative Example 2 | A | A | A | A | C |

TABLE 9

|  | Coating properties | Attachability | Adhesiveness BG | Heat resistance 220° C. CVD 10 minutes | Stripping properties |
|---|---|---|---|---|---|
| Example 18 | A | A | A | A | A |
| Example 19 | A | A | A | A | A |
| Example 20 | A | A | A | A | A |
| Example 21 | A | A | A | A | A |
| Example 22 | A | A | A | A | A |
| Example 23 | A | A | A | A | A |
| Comparative Example 3 | A | A | A | A | C |

TABLE 10

|  | Coating properties | Attachability | Adhesiveness BG | Heat resistance 220° C. CVD 10 minutes | Stripping properties |
|---|---|---|---|---|---|
| Example 24 | A | A | A | A | A |
| Example 25 | A | A | A | A | A |
| Example 26 | A | A | A | A | A |
| Example 27 | A | A | A | A | A |
| Example 28 | A | A | A | A | A |
| Example 29 | A | A | A | A | A |
| Comparative Example 4 | A | A | A | A | C |

TABLE 11

|  | Coating properties | Attachability | Adhesiveness BG | Heat resistance 220° C. CVD 10 minutes | Stripping properties |
|---|---|---|---|---|---|
| Example 30 | A | A | A | A | A |
| Example 31 | A | A | A | A | A |
| Example 32 | A | A | A | A | A |
| Example 33 | A | A | A | A | A |
| Example 34 | A | A | A | A | A |
| Example 35 | A | A | A | A | A |
| Comparative Example 5 | A | A | A | A | C |

As shown in Tables 7 to 11, in a case of using the adhesive compositions of Examples 1 to 35, it was confirmed that the coating properties, the attachability, the adhesiveness, and the heat resistance equivalent to those of the adhesive composition of Comparative Examples 1 to 5 not including the release agent were obtained. In addition, it was confirmed that the glass support could be suitably stripped from the semiconductor wafer substrate by performing the preliminary treatment step.

In addition, from the results in the case of using the adhesive compositions of Examples 24 to 35, it was confirmed that by incorporating a release agent into an elastomer resin, a cycloolefin resin, and the adhesive composition using each simple substance thereof as a thermoplastic resin, it is possible to form a laminate capable of suitably separating the support from the substrate by performing the preliminary treatment step.

Evaluation of Stripping Strength

Evaluation of stripping strength was performed on the laminates in which the adhesive compositions of Examples 1 and 2, and Comparative Example 1 were used. Moreover, evaluation of the stripping strength was performed under the same conditions as in the evaluation of the stripping properties. The evaluation results of the stripping strength are shown in Table 12.

TABLE 12

| Adhesive composition | Release agent | | Stripping properties | Stripping strength [kgf] |
|---|---|---|---|---|
| | Type | Mixing amount | | |
| Example 1 | A | KF-6003 | 1% | A | 1.486 |
| Example 2 | A | KF-6003 | 3% | A | 1.177 |
| Comparative Example 1 | A | — | — | C | 3.800< |

As shown in Table 12, in the laminates of Examples 1 and 2, the stripping strength when the support was stripped from the semiconductor wafer substrate was lower than 1.5 kgf. In contrast, in the laminate of Comparative Example 1, the stripping strength was 3.8 kgf or greater, and it was not possible to strip the support from the substrate without damaging the substrate and the support.

From these evaluation results, it was confirmed that in a case of using the adhesive composition according to an embodiment of the present invention, by mixing a release agent, it was possible to form a laminate in which the support could be suitably separated from the substrate even without providing a release layer which is changed in quality by absorbing light.

Evaluation of Laminate Using Silicon Support

Using the adhesive compositions of Examples 1 to 35 and Comparative Examples 1 to 5, a laminate was produced by laminating a 12 inch silicon carrier (silicon support) and a semiconductor wafer substrate, evaluations of the coating properties, the attachability, the adhesiveness, the heat resistance, and the stripping properties of the adhesive composition in the laminate using each adhesive composition were performed. Moreover, each laminate was produced under the same production conditions as those in the laminate using a glass support except for using a silicon carrier. In addition, the evaluation conditions of the coating properties, the attachability, the adhesiveness, and the heat resistance in each laminate were also the same as those in the laminate using a glass support.

Also in a case of a laminate produced by using a 12 inch-silicon carrier (silicon support) and a semiconductor wafer substrate, using the adhesive compositions of Examples 1 to 35 and Comparative Examples 1 to 5, all of the coating properties, the attachability, the adhesiveness, and the heat resistance were evaluated as "A", similar to the case of the laminate produced by using a glass support.

Evaluation of Stripping Properties by Light Irradiation

The light irradiation step was performed on a laminate produced by laminating a silicon carrier and a semiconductor wafer substrate using the adhesive compositions of Examples 1 to 35 and Comparative Examples 1 to 5, instead of the preliminary treatment step described above, and evaluation of the stripping properties was performed.

Specifically, after a width of 5 mm toward the inside from the outer peripheral portion of each laminate was irradiated with the $CO_2$ laser from the silicon carrier side, as the light irradiation step, the semiconductor wafer substrate side was fixed, and force of 0.5 kgf was applied to the silicon carrier, thereby the stripping step was performed.

The irradiation conditions of the $CO_2$ laser were as follows.

Average output of laser: 100%, 20 W
Scanning speed of laser: 500 mm/sec

In the evaluation of the stripping properties, a laminate in which the silicon carrier could be stripped from the semiconductor wafer substrate by applying force of 0.5 kgf was evaluated as "A", and a laminate in which the silicon carrier could not be stripped from the semiconductor wafer substrate was evaluated as "C".

As the evaluation result of the stripping properties, in the laminates using the adhesive compositions of Examples 1 to 35, the support could be easily stripped from the semiconductor wafer substrate (A). However, in the laminates of Comparative Examples 1 to 5 produced by using the adhesive composition not including a release agent, even in the case where the semiconductor wafer substrate side was fixed and force of 0.5 kgf was applied to the silicon carrier after performing the light irradiation step, the silicon carrier could not be stripped from the semiconductor wafer substrate (C).

Evaluation of Light Irradiation from Substrate Side

Using the adhesive compositions of Examples 1 to 35 and Comparative Examples 1 to 5, a laminate was produced by laminating a semiconductor wafer substrate and a 12 inch-glass support. Moreover, each laminate was coated with an adhesive composition based on the conditions in the evaluation of the coating properties, and the semiconductor wafer substrate and the glass support were attached based on the conditions in the evaluation of the attachability. In addition, after a BG treatment and a plasma CVD treatment were performed on each laminate produced under the conditions, a width of 5 mm toward the inside from the outer peripheral portion of each laminate was irradiated with the $CO_2$ laser from the semiconductor wafer substrate side, then, the semiconductor wafer substrate side was fixed, and force of 0.5 kgf was applied to the glass support, thereby the stripping step was performed. Moreover, the conditions of the $CO_2$ laser irradiation in the light irradiation step were the same as those in Example in which irradiation was performed from the silicon carrier side with light.

As the evaluation result of the stripping properties, in the laminates using the adhesive compositions of Examples 1 to 35, the glass support could be easily stripped from the semiconductor wafer substrate (A), similar to the evaluation result of the stripping properties in the laminate using the silicon carrier. In addition, in the laminates of Comparative Examples 1 to 5, even in a case of performing the light irradiation step, and then, fixing the semiconductor wafer substrate side, and applying force of 0.5 kgf to the glass support, the glass support could not be stripped from the semiconductor wafer substrate (C).

From these results, it could be confirmed that using the adhesive composition according to the present invention, it was possible to form a laminate in which the adhesive strength could be reduced by performing light irradiation instead of the above-described preliminary treatment step, and the support could be suitably stripped from the substrate.

The present invention can be widely used, for example, in a manufacturing step of a fine semiconductor apparatus.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An adhesive composition for temporarily attaching a substrate to a support which supports the substrate, comprising:
   a thermoplastic resin; and
   at least one release agent selected from the group consisting of dimethyl silicone and modified silicones modified by introducing a functional group to at least one part of a terminal and a side chain of dimethyl silicone,
   wherein a kinematic viscosity of the dimethyl silicone or the modified silicone at 25° C. is 20 mm$^2$/s or greater.

2. The adhesive composition according to claim 1,
   wherein the thermoplastic resin is at least one selected from the group consisting of a hydrocarbon resin and an elastomer.

3. The adhesive composition according to claim 2, wherein the elastomer is a hydrogenated styrene elastomer.

4. The adhesive composition according to claim 1, wherein the functional group is at least one functional group selected from the group consisting of a carbinol group, an epoxy group, an amino group, an acrylic group, a methacrylic group, a carboxyl group, a phenol group, a mercapto group, an alkyl group, an aralkyl group, a silanol group, diol, and a polyether.

5. The adhesive composition according to claim 2, wherein the functional group is at least one functional group selected from the group consisting of a carbinol group, an epoxy group, an amino group, an acrylic group, a methacrylic group, a carboxyl group, a phenol group, a mercapto group, an alkyl group, an aralkyl group, a silanol group, diol, and a polyether.

6. The adhesive composition according to claim 3, wherein the functional group is at least one functional group selected from the group consisting of a carbinol group, an epoxy group, an amino group, an acrylic group, a methacrylic group, a carboxyl group, a phenol group, a mercapto group, an alkyl group, an aralkyl group, a silanol group, diol, and a polyether.

7. The adhesive composition according to claim 1,
   wherein the release agent is mixed in a range of 0.01% by weight to 10% by weight with respect to the total amount of the thermoplastic resin.

8. A laminate formed by attaching a substrate to a support which supports the substrate through an adhesive layer formed by using the adhesive composition according to claim 1.

9. A stripping method, comprising:
   removing at least a part of the outer peripheral portion of the adhesive layer in the laminate according to claim 8; and
   stripping the support from the substrate in the laminate after removing at least a part of the outer peripheral portion of the adhesive layer.

10. A stripping method, comprising:
    irradiating at least a part of the outer peripheral portion of the adhesive layer in the laminate according to claim 8 with light; and
    stripping the support from the substrate in the laminate after irradiating at least a part of the outer peripheral portion of the adhesive layer.

* * * * *